United States Patent [19]
Paterson

[11] Patent Number: 5,029,139
[45] Date of Patent: Jul. 2, 1991

[54] WORD ERASABLE BURIED BIT LINE EEPROM

[75] Inventor: James L. Paterson, Richardson, Tex.

[73] Assignee: Texas Instruments Incorporated, Dallas, Tex.

[21] Appl. No.: 382,607

[22] Filed: Jul. 19, 1989

[51] Int. Cl.[5] .............................. G11C 11/40
[52] U.S. Cl. .................... 365/218; 365/185; 365/238.5
[58] Field of Search .............. 365/185, 218, 189.01, 365/238.5, 230.01

[56] References Cited

U.S. PATENT DOCUMENTS 4,408,306 10/1983 Kuo .............................. 365/218

Primary Examiner—Terrell W. Fears
Attorney, Agent, or Firm—W. James Brady, III; james T. Comfort; Melvin Sharp

[57] ABSTRACT

An EEPROM circuit having a word-erase capability is disclosed using buried bit line fabrication techniques. The word-erasable EEPROM uses minimum additional chip area and minimum fabrication process modification.

7 Claims, 4 Drawing Sheets

WORD ERASABLE BURIED BIT LINE EEPROM

BACKGROUND OF THE INVENTION

The invention relates to electrically erasable programmable read only memory devices, specifically those devices having buried bit line array structure, sometimes referred to as ACE or ACEE (advanced contactless EPROM or EEPROM). The invention contemplates such arrays having word erase capability.

Buried bit line EPROM or EEPROM arrays are known which utilize buried, doped lines, usually n+ conductivity doped crystalline silicon under thick field oxide regions as bit lines for the array. The doped lines then act as the source/drain regions of the transistors of the memory cells. A typical EPROM of the advanced contactless array type is disclosed, for example in U.S. Pat. No. 4,698,900, issued Oct. 13, 1987 to A. Esquivel and assigned to Texas Instruments Incorporated.

EEPROMs (electrically erasable programmable read only memories) have been developed which both erase and program information from a single memory cell by tunneling charges through insulators. Such devices are discussed in "Comparisons and Trends in Today's Dominant $E^2$ Technologies", by S. Lai, et al., 1986 *IEDM Digest of Technical Papers*, pp. 580-583.

Hybrids of the EEPROMs discussed above are also known, such as Flash EEPROMs which program by either avalanche injection or tunneling and which erase by tunneling. Such devices have generally been limited to bulk erasure in which the whole memory array is erased electrically at once. An example of a Flash EEPROM which is programmed by avalanche injection and erased by tunneling is described by F. Matsuoka, et al., "A 256K Flash EEPROM Using Triple Level Polysilicon Technology", 1985 *ISSCC Digest of Technical Papers*, pp. 168-169.

SUMMARY OF THE INVENTION

The present invention is a EEPROM having word-erase capability. The EEPROM further can be fabricated using a buried bit line configuration. A word-erase transistor may be fabricated having its gate connected to a word line of the EEPROM array and one source/drain electrode connected to a word erase line and the other source drain connected to a control gate line which is common to a specific number of storage transistors which number comprises a word.

In the configuration of the EEPROM of the instant invention, therefore, a single word, for example, a byte or two byte word, may be erased and reprogrammed rather than the whole array as in prior art flash EEPROMs.

Also according to the instant invention, a word-erasable EEPROM may be fabricated by standard buried bit line processes with very little modification of the process and minimum additional process steps.

Also according to the instant invention, a word-erasable EEPROM may be fabricated using buried bit line architecture wherein the storage, control, and erase transistors may be configured within a minimum area.

Figure 1:
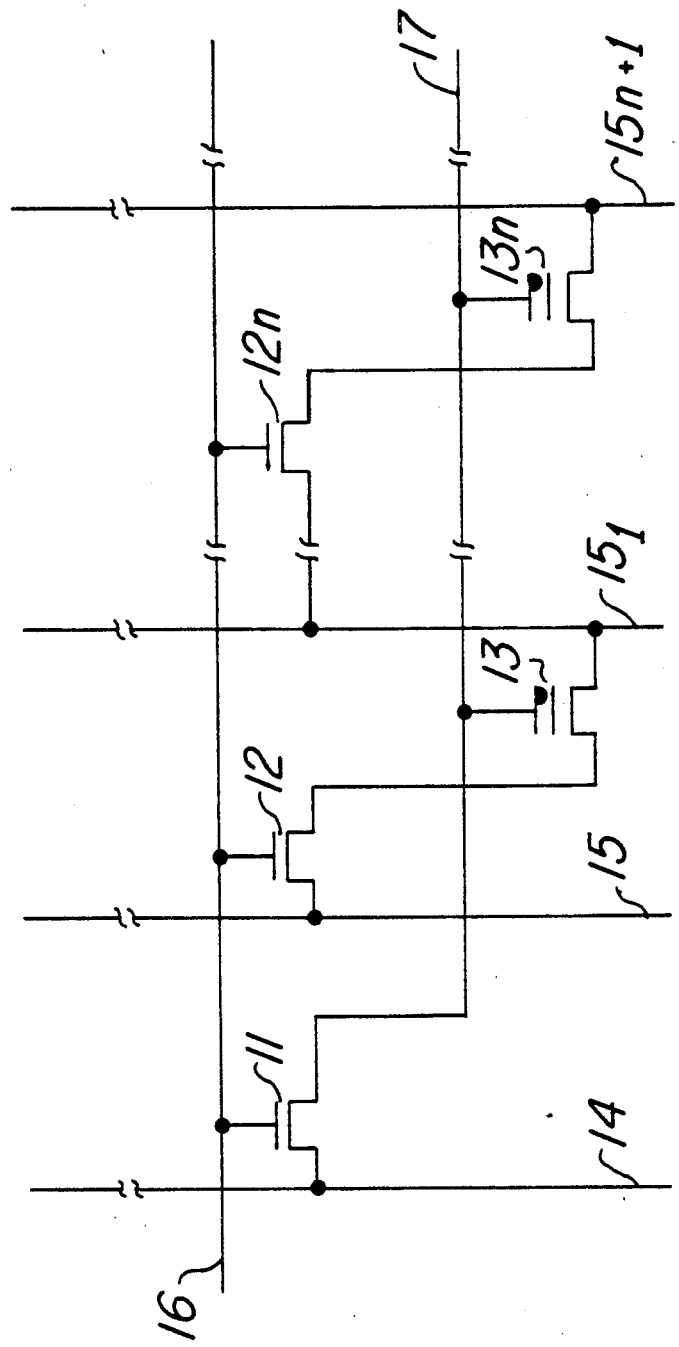
FIG. 1 is a schematic diagram of a section of the EEPROM array according to the invention.

The circuit configuration of a word-erasable EEPROM according to an embodiment of the invention will be explained with reference to FIG. 1. A number n of storage transistors 13 through 13n are arranged with control gates connected commonly and to a source/drain region of a word-erase transistor 11. The other source/drain region of word-erase transistor 11 is connected to a word erase line 14. A source/drain region of each storage transistor 13-13n is connected to a bit line 15 through 15n+1. The other source/drain region of each storage transistor 13-13n is connected to a source/drain region of a pass transistor 12 through 12n. The second source/drain region of each pass transistor 12-12n is connected to a bit line 15 through 15n, respectively. The gates of pass transistors 12-12n as well as the gate of word-erase transistor 11 are connected to a single word line 16. As is indicated in FIG. 1, each storage transistor 13-13n has a floating gate and each floating gate, as indicated has a thin tunneling window. In the circuit configuration shown in FIG. 1, a specified number of pass transistor-storage transistor pairs such as eight or sixteen are associated with a single word-erase transistor 11 and word-erase line 14. Byte-erase transistor 11 and word-erase line 14, in the standard EEPROM array, would then be repeated every eight or sixteen bit (storage transistors) or as desired. It is contemplated also that the disclosed configuration may be used wherein only one erase transistor and erase line is utilized to erase a word line at a time.

The operation of a word of memory cells in the EEPROM of the invention is summarized in the following table and with reference to FIG. 1.

|  | BYTE ERASE LINE 14 | BIT LINE 15 | BIT LINE 15₁ | WORD LINE 16 | CONTROL GATE 17 |
| --- | --- | --- | --- | --- | --- |
| ERASE | Hi Volt | Ground | Ground | Hi Volt | Hi Volt |
| WRITE | Ground | Hi Volt | Float | Hi Volt | Ground |
| READ | Low Volt | Low Volt | Ground | Low Volt | Low Volt |

Figure 2A:
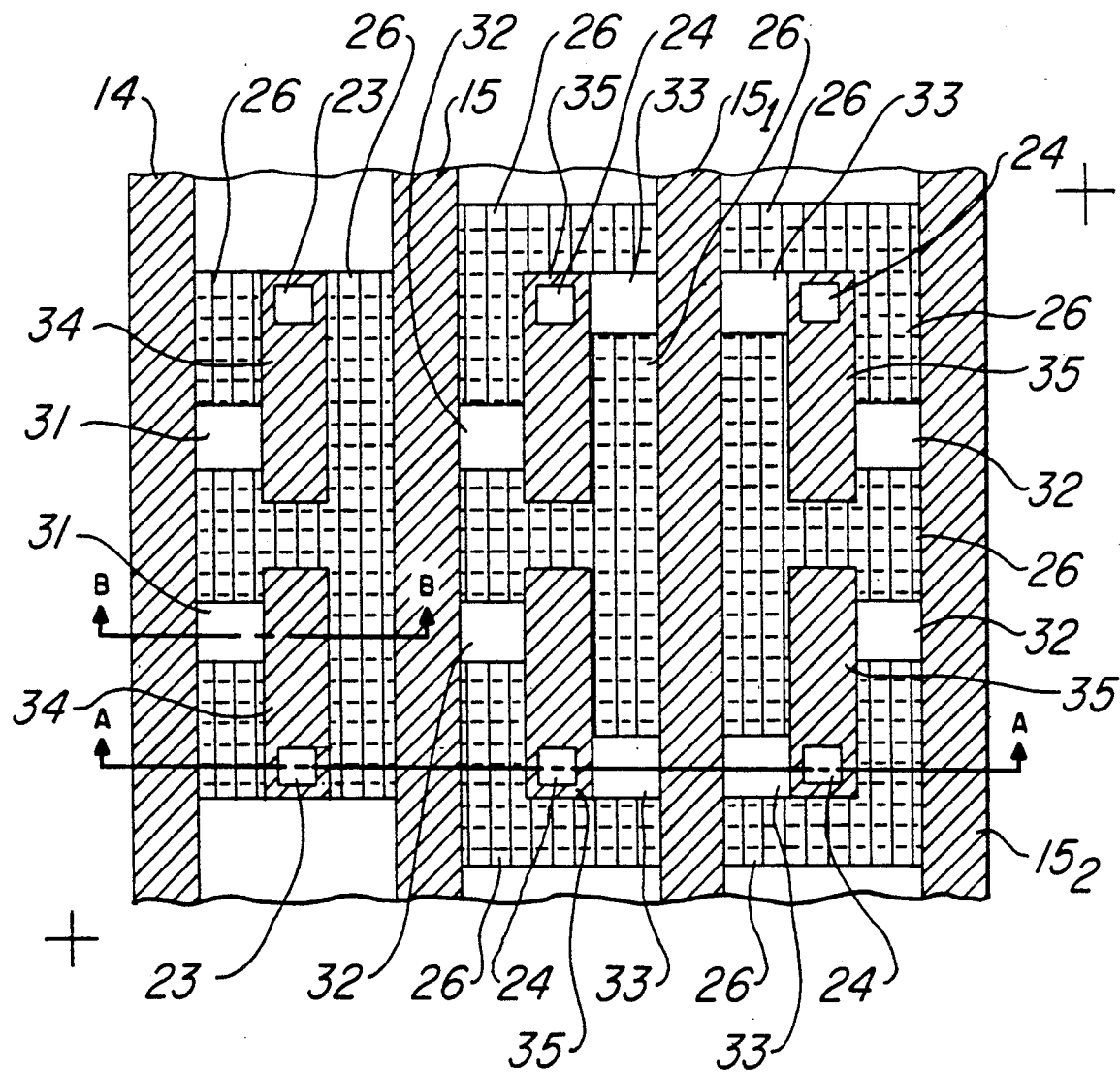
FIG. 2a is a diagram, in greatly enlarged scale, showing a top view of a section of an EEPROM of the instant invention ending at the substrate level.
Figure 2B:
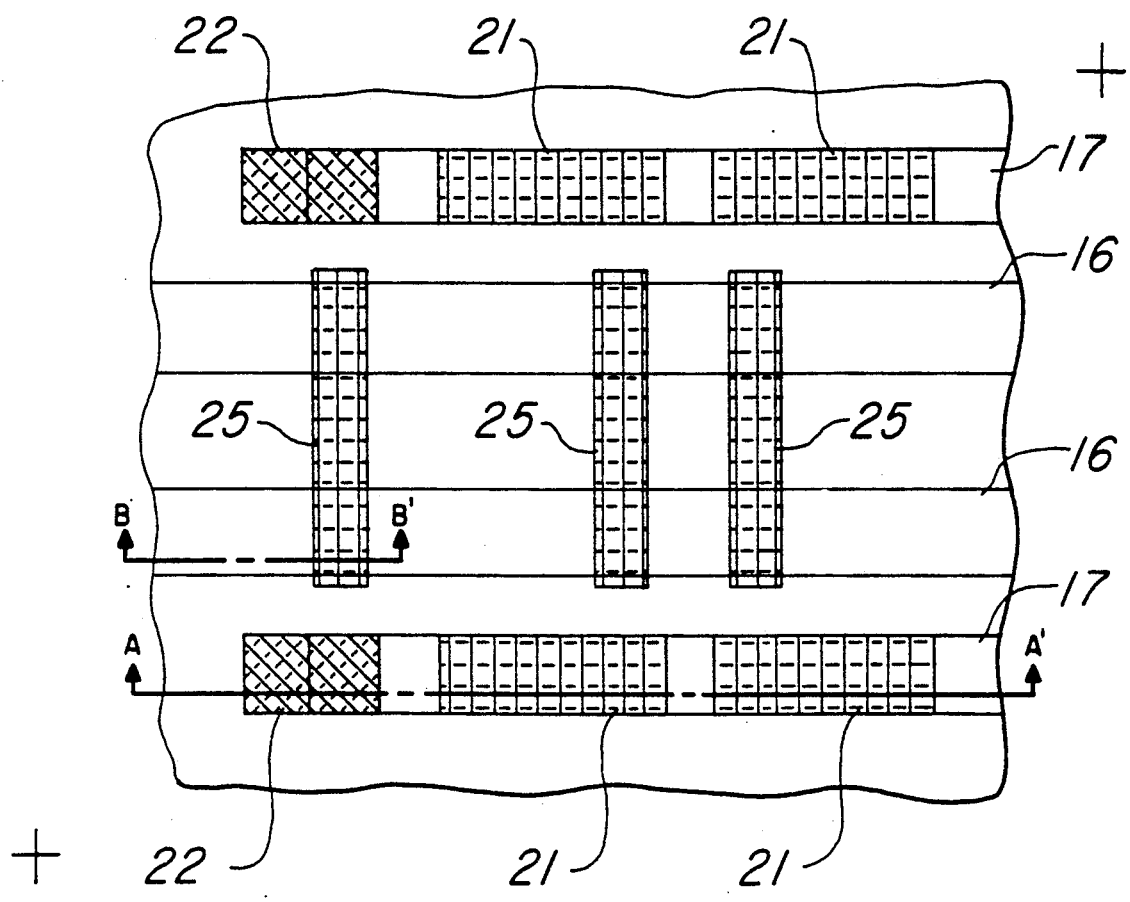
FIG. 2b is a diagram, in greatly enlarged scale, showing a top view of the same section of an EEPROM according to the instant invention including contact and conductive levels above the substrate level.

The layout of an EEPROM according to an embodiment of the invention will be now explained with reference to FIGS. 2a and 2b which illustrate a greatly enlarged view of a substrate level, and the contact and conductor levels which overly the substrate level, respectively, of a four cells of the EEPROM integrated circuit. Byte erase line 14 of the portion of circuits of FIGS. 2a and 2b is a buried conductive line, such a doped n+ region of the substrate buried under a thick oxide, as will be further illustrated in the cross-sectional views of FIGS. 3 and 4. Bit lines 15, 15₁ and 15₂ are buried bit lines, also, for example n+ doped lines under thick oxide layers, which also act as source/drain regions of the pass transistors and storage transistors of the memory cells, as will be seen. Patterned thick field oxide regions 26 isolate the word erase line 14 and bit lines 15, 15₁, and 15₂ except in areas 31, areas 32 and areas 33 which allow the word erase transistors, pass transistors, and storage transistors, respectively, to be formed. Contact hole 23 allows contact to be made from buried line 34, which forms a source/drain region of the word-erase transistor, to control gate line 17.

Tunnel windows 24 are cut through the thick oxide layers over buried n+ lines 35, which form source/drain regions of pass transistors 12-12n and storage transistors 13-13n. These tunnel windows 24 may be patterned and etched in accordance with any of several known fabrication methods including self-aligning methods presently developed. The critical parameter of these tunnel windows 24 is that the oxide thickness above buried n+ regions 28 must be thin enough to allow the well known tunneling phenomena to occur for writing and/or erasing to the storage transistors 13-13n.

Floating gate regions 21, which may be a first level polycrystalline silicon (polysilicon), form the floating gates of storage transistors 13-13n. These floating gate regions overly tunnel windows 24 and also the thin oxide regions between source/drain regions of storage transistors 13-13n. Also, strap isolation regions 25 may be formed of the same first level polysilicon layer. These isolation regions 25, if used, further isolate word lines from the substrate, as is well known in the art.

Word lines 16, which may be formed from a second level polysilicon layer, extend in a horizontal direction as shown, overlying the substrate level and forming the gates of word erase transistor 11 above area 31 and forming the gates of pass transistors 12-12n over areas 32.

Control gate lines 17 may also be formed from the second polysilicon level. These lines 17 also extend in a horizontal direction as shown, overlying floating gate regions 21, with insulating layer (e.g. silicon dioxide) there between. These lines 17 form the control gates of storage transistors 13-13n.

Contact straps 22, which may be metallic such as aluminum, extend into contact holes 23 and 36 to contact buried n+ region 34 and control gate lines 17 through thick oxide layer 37, thereby connecting, electrically, the source drain region of word-erase transistor 11 with the control gates of storage transistors 13-13n.

Figure 3:
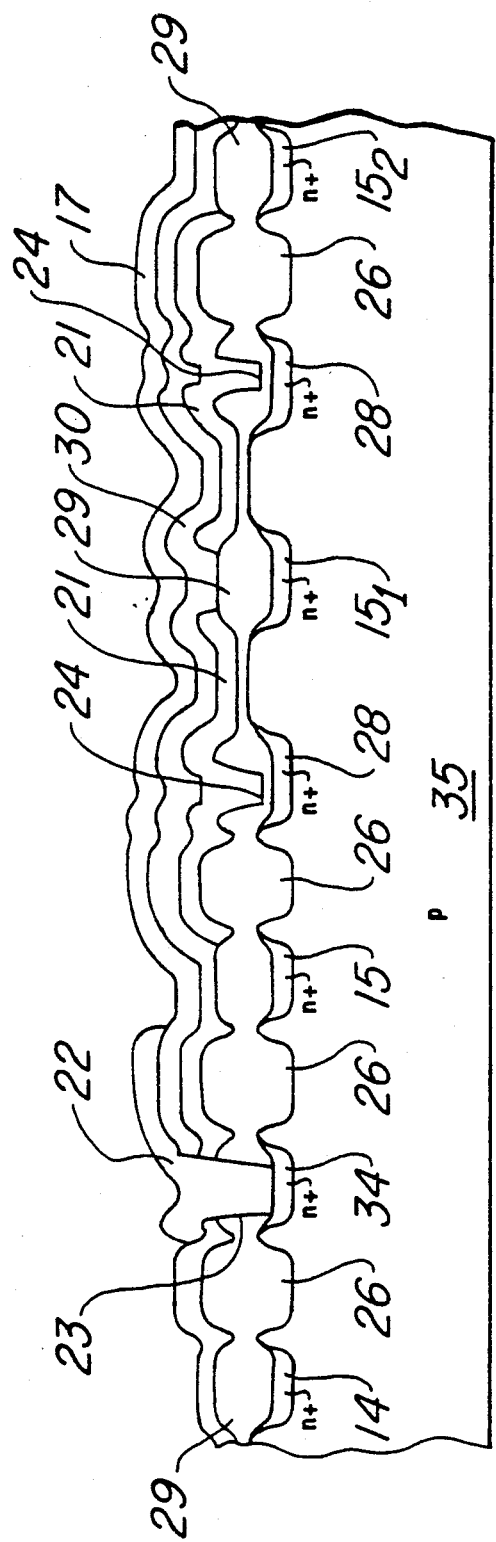
FIG. 3 is a cross sectional view along sectional line AA' of the EEPROM segment of FIGS. 2a and 2b.
Figure 4:
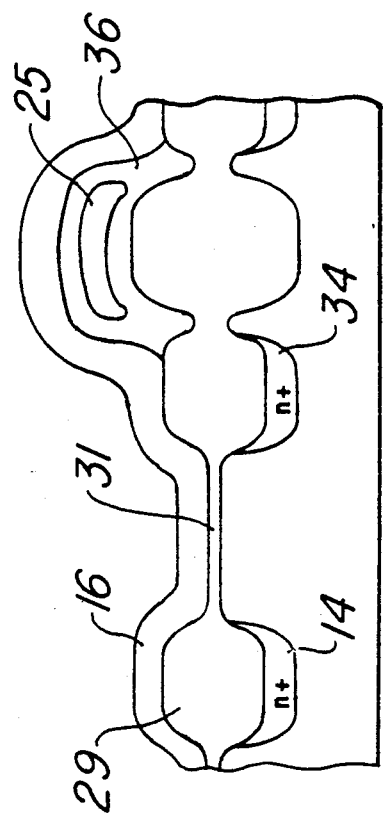
FIG. 4 is a cross sectional view along sectional line BB' of the EEPROM segment of FIGS. 2a and 2b.

Further understanding of other embodiments according to the invention may be had with reference to the cross-sectional drawings of the EEPROM integrated circuit of FIGS. 3 and 4, taken along sectional lines AA' and BB' respectively, and the following description.

Substrate 35, which may be single-crystal silicon, doped as required with p-type impurities, underlies the circuit. Buried n+ region 14 lies beneath thick oxide region 29 forming word-erase line 14 and a source/drain region of word erase transistor 11 at area 31, as shown in FIG. 4. Thick field oxide regions 26 isolate buried n+ regions and separate word lines 16 from the substrate regions.

Buried n+ region 34 acts as a source/drain region of word erase transistor 11, as shown in FIG. 4 and is covered by a thick oxide region. Contact hole 23 is etch through this thick oxide to the buried n+ region 34.

Buried n+ regions 15, 15₁ and 15₂ also underlie thick oxide regions 29 and form buried bit lines 15, 15₁ and 15₂ and source/drain regions for the pass transistors 12-12n and storage transistors 13-13n.

Buried n+ regions 28 also underlie thick oxide regions and form the other source/drain regions for pass transistors 12-12n and storage transistors 13-13n and electrically connect cell pairs of these transistors, e.g. pass transistor 12 to storage transistor 13, from source/drain to source/drain. The thick oxide regions above buried n+ regions 28 has a tunnel hole 24 etched through to the n+ region; a very thin layer of oxide or other insulator is then formed over the n+ region.

A first level polysilicon layer is patterned and etched to form floating gates 21 and strap isolation regions 25. The floating gates 21 (storage gates) extend into tunnel window holes 24 and overly regions 33 to form the floating gates (storage gates) of storage transistors 13-13n. An insulating layer 30, e.g. silicon dioxide plus silicon nitride, is formed over the first polysilicon layer to isolate that layer from the regions of the second polysilicon layer. Note also that contact window 23 extends through this insulating layer 30.

The second conducting layer, e.g. polysilicon, is patterned and etched, as is known, to form word lines 16 and control gate lines 17. Word lines 16 also form the gates of word erase transistor 11 and pass transistors 12-12n. Control gate lines 17 also form the control gates of storage transistors 13-13n.

Conductive strap 22 extends into contact window 23 and into contact window 36 to electrically contact control gate line 17. Although strap 22 is shown overlying control gate lines 17, this strap 22 may also underlie the control gate lines 17. Conductive strap 22 may be metallic, for example, aluminum and is patterned and etched by well known techniques.

Therefore, it may be seen, that a word-erase transistor 11 is formed across area 31 from word-erase lines 14 to buried n+ regions 34 with word lines 16 acting as gates of the word-erase transistor. The source-drain region of word-erase transistors 11 formed by buried n+ region 34 is then electrically strapped to the control gates of a number of storage transistors 13-13n by control gate line 17, thus controlling a word erase of n storage transistors 13.

The drawing FIGS. 2a and 2b and descriptions show only a portion of an EEPROM array, according to the invention, comprising two word erase transistors, each controlling the erase mode of two memory cells. Each memory cell shown consists of a pass transistor and storage transistor pair. Therefore, a total of four memory cells are shown in the segment of the EEPROM integrated circuit depicted in FIGS. 2a and 2b. It is to be understood that an EEPROM array according to the instant invention would include thousands or millions of memory cells and associated control circuitry, as is known in the art, such as row decoders and column decoders and read/write select circuitry.

Also, the described embodiment has been explained in the context of silicon fabrication technology. It is to be understood, however, that other materials, wherever silicon materials are suggested, may be substituted according to their known properties and fabrication processes. Also, doping types, as suggested, may be alternately of the opposite doping types as is known in the art.

While this invention has been described with reference to an illustrative embodiment, this description is not intended to be construed in a limiting sense. Various modifications of the illustrated embodiment, as well as other embodiments of the invention, will be apparent to those skilled in the art upon reference to this description. It is, therefore, contemplated that the appended claims will encompass any such modification or embodiment as fall within the scope of the invention.

What is claimed is:

1. A word-erasable electrically erasable programmable read only memory circuit having memory cells operatively arranged in rows and columns, wherein: each row of said memory cells includes m word-erase transistors, each word-erase transistor being electrically connected to and controlling, during an erase cycle, n of said memory cells of a row, where m is a positive integer and n is the number of cells in said row divided by m, each of said memory cells comprises a pass transistor and a storage transistor, each of said pass transistors and each of said storage transistors has a pair of source/drain regions, each of said source/drain regions comprises a buried, doped conductive region buried under a thick insulating region, and at least some of said buried, doped conductive regions also comprise bit lines of said circuit.

2. The word-erasable electrically erasable programmable read only memory circuit of claim 1 wherein: m is greater than 1.

3. The word-erasable electrically erasable programmable read only memory circuit of claim 1 wherein: n is 8 or 16 or 32, etc.

4. The word-erasable EEPROM circuit of claim 1 wherein:
each of said word-erase transistors is electrically connected from a source/drain region of each of said word-erase transistors to control gates of n said storage transistors.

5. The word-erasable EEPROM circuit of claim 4 wherein:
each of said word-erase transistors is electrically connected at its gate to a gate of n of said pass transistors.

6. The word-erasable EEPROM circuit of claim 1 wherein:
said buried, doped, conductive regions are n+ doped regions of a single-crystal silicon substrate.

7. The word-erasable EEPROM circuit of claim 1 wherein:
each of said word-erase transistors also comprises a pair of source/drain regions;
each of said source/drain regions of said word-erase transistor also comprises a buried, doped, conductive region buried under a thick insulating region, and;
one of said source/drain regions of each of said word-erase transistors comprises a word-erase line of said circuit.

* * * * *